US008963285B2

(12) United States Patent
Bakalski et al.

(10) Patent No.: US 8,963,285 B2
(45) Date of Patent: Feb. 24, 2015

(54) SEMICONDUCTOR DEVICE AND METHOD OF MANUFACTURING THEREOF

(71) Applicant: Infineon Technologies AG, Neubiberg (DE)

(72) Inventors: Winfried Bakalski, Munich (DE); Anton Steltenpohl, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/790,117

(22) Filed: Mar. 8, 2013

(65) Prior Publication Data

US 2014/0252540 A1 Sep. 11, 2014

(51) Int. Cl.
| | | |
|---|---|---|
| *H01L 27/08* | (2006.01) | |
| *H01L 23/552* | (2006.01) | |
| *H01L 29/40* | (2006.01) | |
| *H01L 23/28* | (2006.01) | |
| *H01L 21/78* | (2006.01) | |
| *H01L 23/50* | (2006.01) | |
| *H01L 23/538* | (2006.01) | |
| *H01L 23/00* | (2006.01) | |

(52) U.S. Cl.
CPC ............... *H01L 23/28* (2013.01); *H01L 21/78* (2013.01); *H01L 23/50* (2013.01); *H01L 23/538* (2013.01); *H01L 24/97* (2013.01); H01L 2224/16225 (2013.01); H01L 2224/97 (2013.01)
USPC .... 257/531; 257/659; 257/774; 257/E21.449; 257/E23.114; 257/E29.325; 438/113; 438/106

(58) Field of Classification Search
CPC ... H01L 23/481; H01L 25/03; H01L 25/0657; H01L 23/3121; H01L 2224/04042; H01L 2224/05009; H01L 2224/32145; H01L 2224/48145; H01L 2224/48227; H01L 2224/9202; H01L 2225/06506; H01L 2225/0651; H01L 2225/06541; H01L 2225/06562; H01L 2924/3512; H01L 23/3114; H01L 23/28; H01L 23/538; H01L 23/50; H01L 21/78
USPC ......... 257/659, 660, 667, 676, 678, 687, 700, 257/734, 774, 777, E21.001, E21.499, 257/E23.114, E23.01, E23.06, 531, 532, 257/E21.704, E23.061, E29.325; 438/15, 438/25, 26, 51, 55, 64, 106
See application file for complete search history.

(56) References Cited

U.S. PATENT DOCUMENTS

| | | | | |
|---|---|---|---|---|
| 2006/0133055 | A1* | 6/2006 | Uematsu et al. | 361/760 |
| 2009/0072394 | A1* | 3/2009 | Onodera et al. | 257/737 |
| 2012/0034740 | A1* | 2/2012 | Yean et al. | 438/107 |
| 2013/0020726 | A1* | 1/2013 | Kim et al. | 257/787 |
| 2013/0087898 | A1* | 4/2013 | Chi et al. | 257/666 |

* cited by examiner

*Primary Examiner* — Wensing Kuo
*Assistant Examiner* — Moazzam Hossain
(74) *Attorney, Agent, or Firm* — Slater & Matsil, L.L.P.

(57) ABSTRACT

A semiconductor device includes a semiconductor substrate having a first main surface in which a recess is formed. Further, the semiconductor device includes an electrical interconnect structure which is arranged at a bottom of the recess. A semiconductor chip is located in the recess. The semiconductor chip includes a plurality of chip electrodes facing the electrical interconnect structure. Further, a plurality of electrically conducting elements is arranged in the electrical interconnect structure and electrically connected to the plurality of chip electrodes.

15 Claims, 5 Drawing Sheets

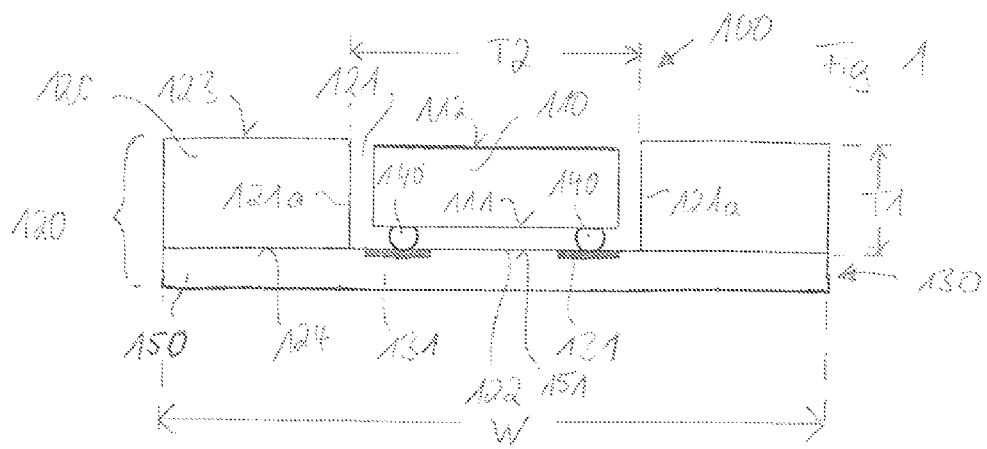
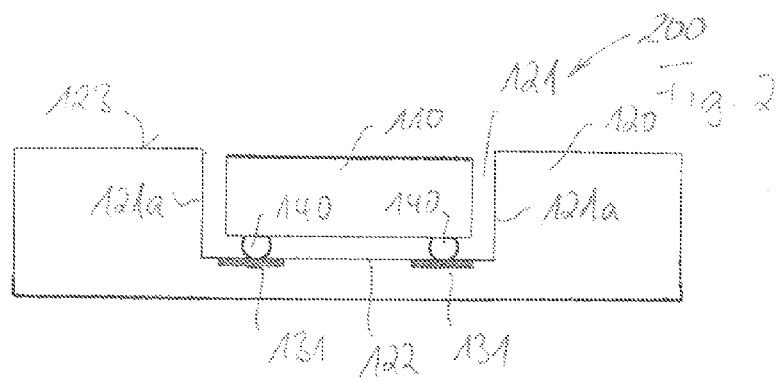
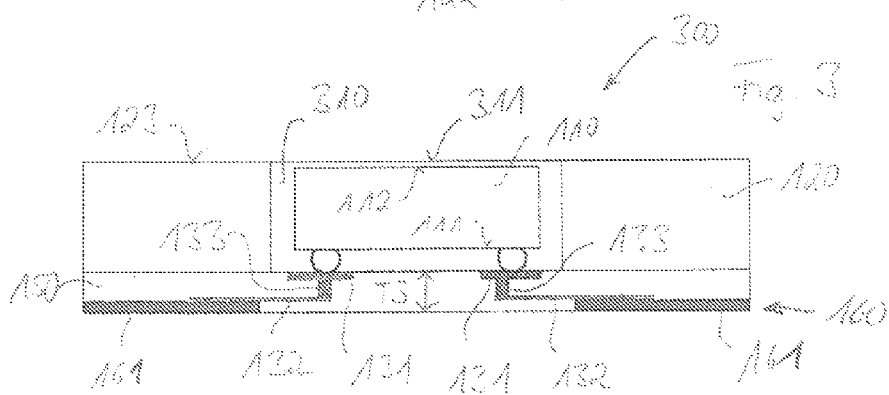
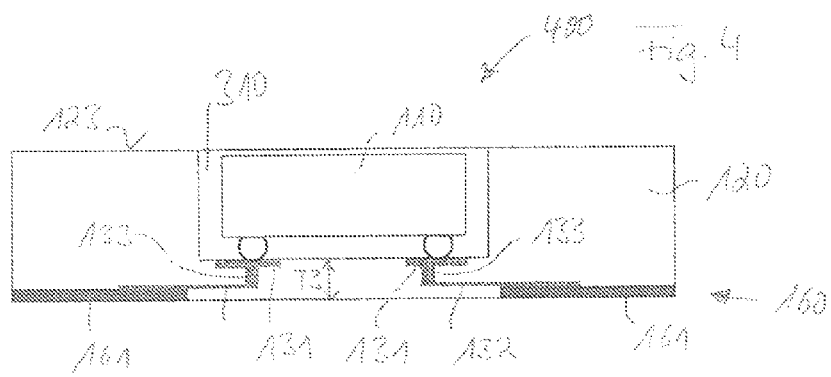

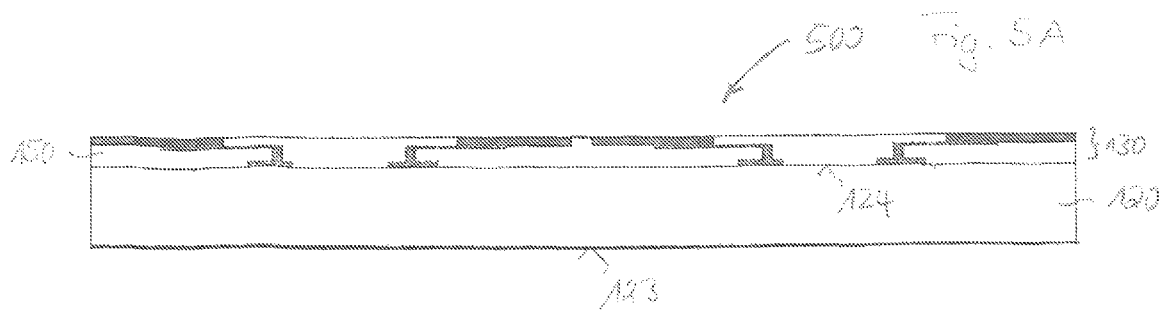
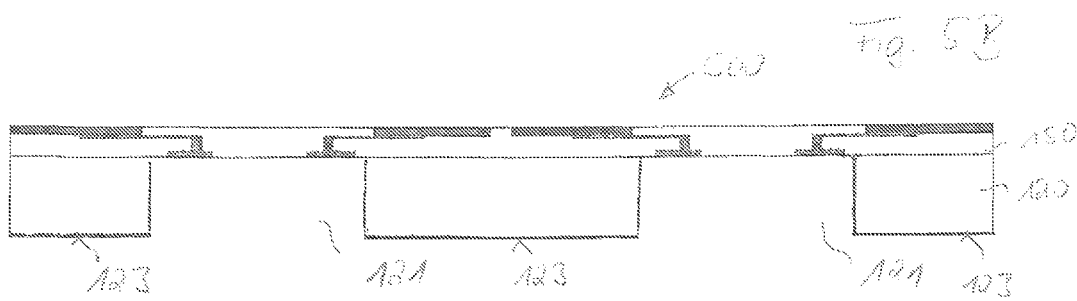
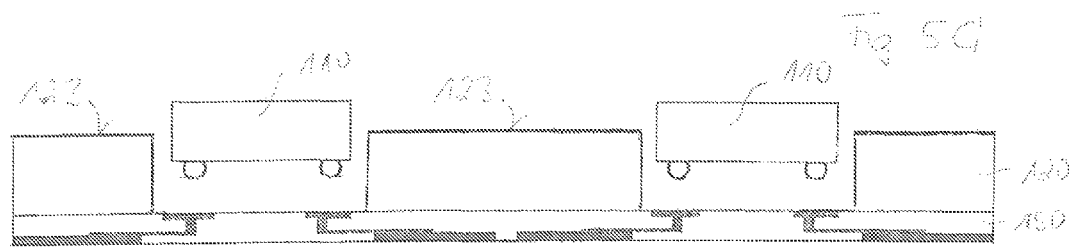
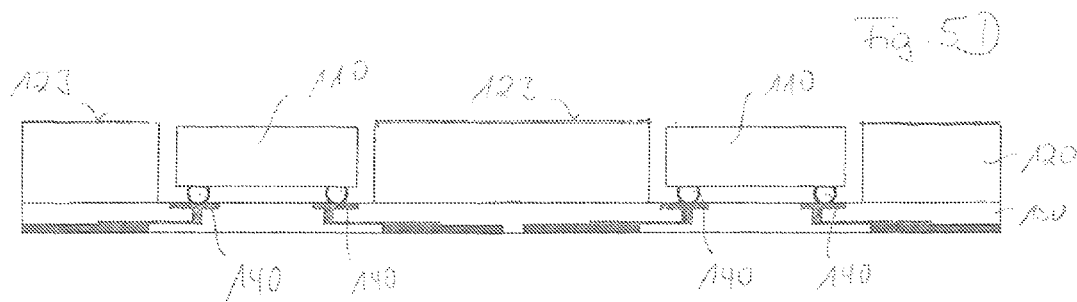

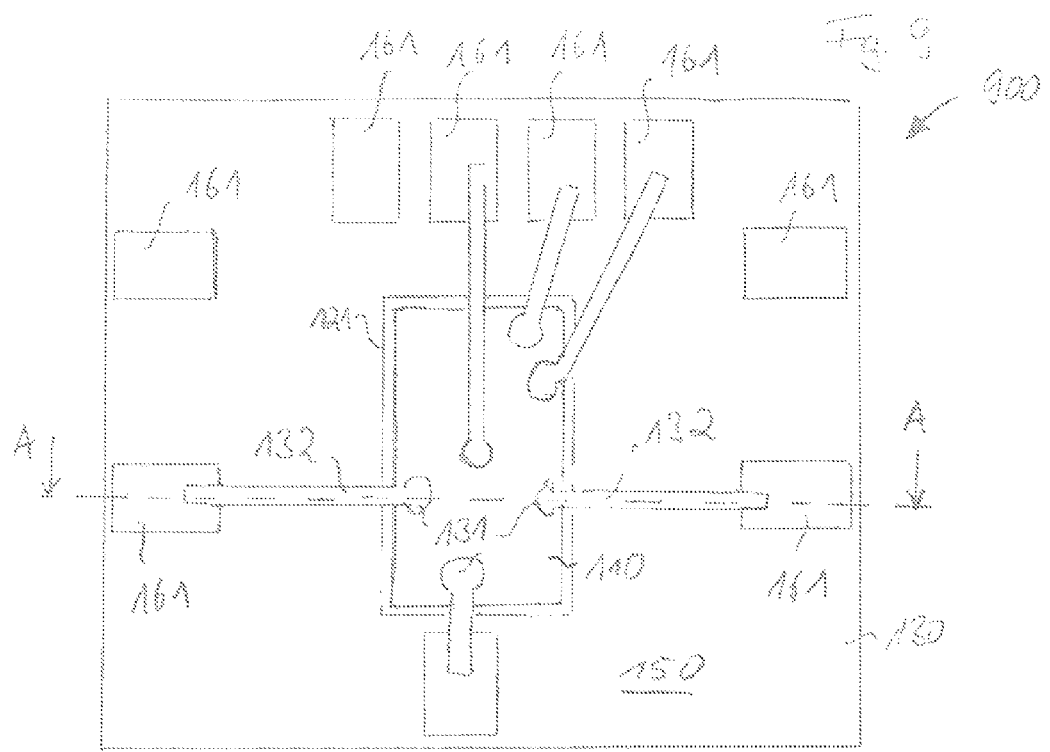
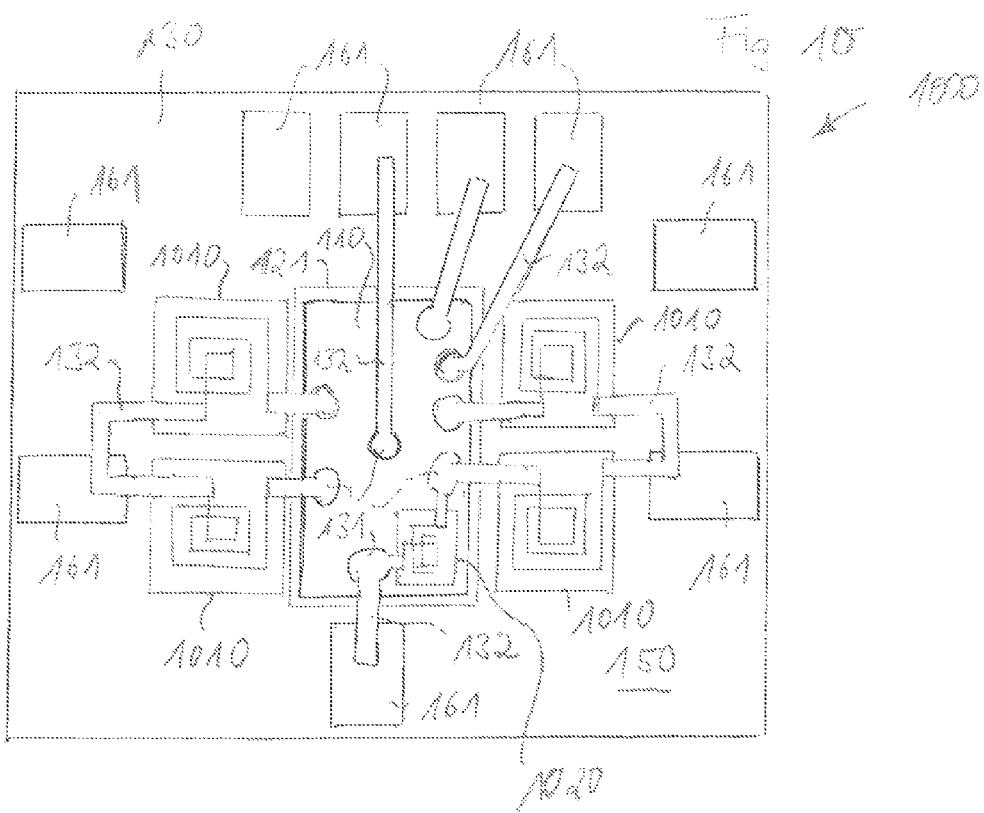

SEMICONDUCTOR DEVICE AND METHOD OF MANUFACTURING THEREOF

TECHNICAL FIELD

The invention relates to semiconductor devices, and more particularly to a technique of packaging a semiconductor chip.

BACKGROUND

Semiconductor device manufacturers are constantly striving to increase the versatility and performance of their products, while decreasing their cost of manufacture. An important aspect in the manufacture of semiconductor devices is packaging the semiconductor chips. As those skilled in the art are aware, integrated circuits are fabricated on wafers, which are then singulated to produce semiconductor chips. One or more semiconductor chips are placed in a package to protect them from environmental and physical impact. Packaging also involves electrically coupling semiconductor chip electrodes to external terminals of the semiconductor device. Packaging methods providing high performance devices at low expenses are desirable.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 schematically illustrates a cross-sectional view of an exemplary semiconductor device;

FIG. 2 schematically illustrates a cross-sectional view of an exemplary semiconductor device;

FIG. 3 schematically illustrates a cross-sectional view of an exemplary semiconductor device;

FIG. 4 schematically illustrates a cross-sectional view of an exemplary semiconductor device;

FIGS. 5A-5E schematically illustrate cross-sectional views of an exemplary process of a method of manufacturing a semiconductor device;

FIG. 9 schematically illustrates a plan view of an exemplary semiconductor device; and FIG. 10 schematically illustrates a plan view of an exemplary semiconductor device comprising passive elements.

DETAILED DESCRIPTION OF ILLUSTRATIVE EMBODIMENTS

Figure 5E:
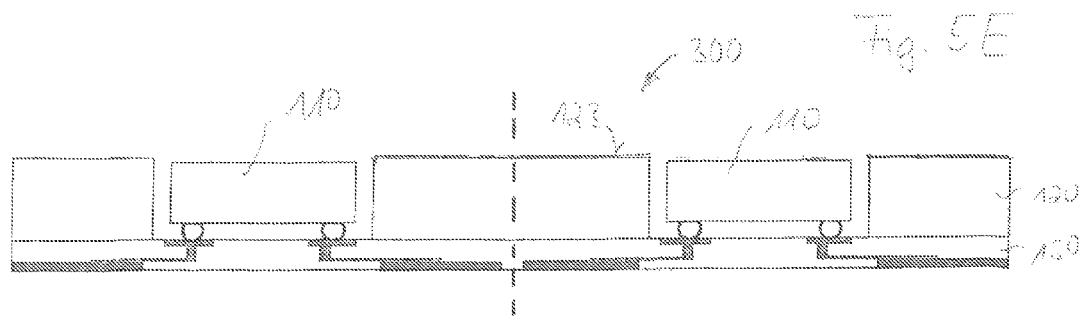

In the following detailed description, reference is made to the accompanying drawings, which form a part thereof, and in which is shown by way of illustration specific embodiments in which the invention may be practiced. In this regard, directional terminology, such as "top," "bottom," "left," "right," "upper," "lower" etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise or unless technically restricted.

As employed in this specification, the terms "bonded," "attached," "connected," "coupled" and/or "electrically coupled" are not meant to mean that the elements or layers must directly be contacted together; intervening elements or layers may be provided between the "bonded," "attached," "connected," "coupled" and/or "electrically coupled" elements, respectively. However, the above-mentioned terms may, optionally, also have the specific meaning that the elements or layers are directly contacted together, i.e., that no intervening elements or layers are provided between the "bonded," "attached," "connected," "coupled" and/or "electrically coupled" elements, respectively.

The semiconductor devices described below contain one or more semiconductor chips. The semiconductor chips may be manufactured by different technologies and may include, for example, integrated electrical, electro-optical or electro-mechanical circuits and/or passives.

The semiconductor chips may comprise integrated circuits such as, e.g., logic integrated circuits, control circuits, microprocessors, memory devices, power devices, etc. In particular, the semiconductor chips described herein may comprise RF (radio frequency) circuitry. By way of example, they may implement antenna switches, antenna tuners, etc.

The semiconductor chips may have electrodes (or contact elements or contact pads) which allow electrical contact to be made with the integrated circuits included in the semiconductor chips. The electrodes may include one or more metal layers that are applied to the semiconductor material. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The semiconductor devices described herein may include external contact elements (e.g., terminal pads), which may be of any shape and size. The external contact elements may be accessible from outside the device and may thus allow electrical contact to be made with the semiconductor chip(s) from outside the device. For this reason, the external contact elements may have external contact surfaces which can be accessed from outside the device. Furthermore, the external contact elements may be thermally conductive and may serve as heat sinks for dissipating the heat generated by the semiconductor chips. The external contact elements may be composed of any desired electrically conductive material, for example, of a metal, such as copper, aluminum or gold, a metal alloy or an electrically conducting organic material.

FIG. 1 illustrates an exemplary semiconductor device 100. The semiconductor device 100 comprises a semiconductor chip 110, a semiconductor substrate 120 having a recess 121 and an electrical interconnect structure 130 arranged at a bottom 122 of the recess 121. The recess 121 is formed in a first main surface 123 of the semiconductor substrate 120. The semiconductor chip 110 is accommodated in the recess 121. By way of example, the semiconductor chip 110 is surrounded to all sides by side wall faces 121a of the recess 121.

The semiconductor chip 110 has a first main surface 111 and a second main surface 112 opposite to the first main surface. The first main surface 111 of the semiconductor chip 110 may be provided with chip electrodes (not shown). The chip electrodes may be electrically connected to an integrated circuit contained in the semiconductor chip 110.

The semiconductor device 100 may further comprise electrical contact elements 140. The electrical contact elements 140 may be configured to electrically couple the semiconductor chip 110 to the electrical interconnect structure 130. More specifically, recess contact pads 131 formed out of, e.g., a first structured metal layer of the electrical interconnect structure 130 may be electrically coupled via the electrical contact elements 140 to the chip electrodes (not shown) of the semiconductor chip 110. As shown in FIG. 1, the semiconductor chip 110 may be flip-chip bonded to the electrical interconnect structure 130.

The electrical contact elements 140 may further be used to mechanically fix the semiconductor chip 110 to the bottom 122 of the recess 121. The electrical contact elements 140 may be implemented, e.g., by solder bonds, diffusion solder bonds, metal pillars, electrically conductive adhesive bonds, sintered metal bonds, bonds made of a nano-paste, etc.

The depth of the recess 121 as measured between the first main surface 123 of the semiconductor substrate 120 and the bottom 122 of the recess 121 is denoted by T1. T1 may, e.g., be equal to or greater than 50 μm, 100 μm, 200 μm, 600 μm. Further, T1 may be equal to or less than, e.g., 1 mm, 600 μm, 400 μm, 200 μm, 100 μm.

The recess 121 may have a width T2 measured between opposing side wall faces 121a of the recess 121. T2 may, e.g., be equal to or greater than 0.3 mm, 0.5 mm, 0.8 mm, 1.0 mm, 1.5 mm. Further, T2 may, e.g., be equal to or less than 2 mm, 1.5 mm, 1.0 mm, 0.8 mm, 0.5 mm.

The semiconductor chip 110 may have lateral dimensions which are smaller than the corresponding lateral dimensions of the recess 121 as, e.g., stated above. The semiconductor chip 110 may have a vertical dimension which is, e.g., less than the depth T1 of the recess 121 as, e.g., stated above. Thus, by way of example, the semiconductor chip 110 may have a height measured between the first main surface 111 and the second main surface 112 which is equal to or less than 1000 μm, 800 μm, 500 μm, 200 μm, 100 μm, 50 μm. Further, the semiconductor chip may have lateral dimensions which are equal to or less than 2 mm, 1 mm, 0.8 mm, 0.5 mm.

The semiconductor device 100 may have a width W equal to or greater than, e.g., 0.5 mm, 1 mm, 3 mm, 5 mm, 10 mm. Further, W may, e.g., be equal to or less than 10 mm, 5 mm, 3 mm, 1 mm, 0.8 mm.

As illustrated in FIG. 1, the level of the second main surface 112 of the semiconductor chip 110 may be below the level of the first main surface 123 of the semiconductor substrate 120. Further, the side walls of the semiconductor chip 110 may be spaced apart from the side wall faces 121a of the semiconductor substrate 120, e.g., by a distance equal to or greater than 5 μm, 10 μm, 20 μm, 50 μm, 100 μm.

The semiconductor substrate 120 may have a second main surface 124 opposite to the first main surface 123. A layer of insulating material 150 of the electrical interconnect structure 130 may be attached to the second main surface 124 of the semiconductor substrate 120. An upper surface 151 of the layer 150 of insulating material may form the bottom 122 of the recess 121. Thus, the recess 121 may completely extend through the semiconductor substrate 120 such that the recess 121 exposes the upper surface 151 of the layer 150 of insulating material.

The semiconductor substrate 120 may, e.g., comprise or be made of a bulk semiconductor material, e.g., silicon, more specifically, e.g., polycrystalline silicon or crystalline silicon. The semiconductor material of the semiconductor substrate 120 and the semiconductor material of the semiconductor chip 110 may, e.g., be the same material, e.g., silicon.

The insulating layer 150 may, e.g., comprise or be made of an inorganic material or may, e.g., comprise or be made of an organic material. The inorganic material may, e.g., be selected from the group consisting of silicon oxide, silicon nitride or mixed silicon oxide-nitride. These layers are often referred to as hard passivation layers. As known to a person skilled in the art, inorganic layers may be applied onto the semiconductor substrate 120 during frontend wafer processing, e.g., by sputtering, CVD (chemical vapor deposition), PVD (physical vapor deposition) or other deposition methods.

A layer 150 of insulating material made of an organic material may, e.g., be provided by a polymer layer. A polymer layer may be applied during backend wafer processing (i.e., packaging), e.g., by spin-coating, lamination, printing, plasma-deposition, etc.

As exemplified in FIG. 1, the upper surface 151 of the layer 150 of insulating material forming the bottom 122 of the recess 121 may essentially level with the second main surface 124 of the semiconductor substrate 120. By way of example, as exemplified in FIG. 1, the second main surface 124 of the semiconductor substrate 120 may extend at a level lower than the level of the first main surface 111 of the semiconductor chip 110.

The semiconductor polymer material of the semiconductor substrate 120 may, e.g., have an electrical conductivity equal to or greater than 20, 50, 100, 500, 1000, 2000 kΩcm. The higher the electrical conductivity, the more radiation is absorbed by the semiconductor material. In other words, the higher the electrical conductivity the less transparent is the semiconductor material of the semiconductor substrate 120 to radiation to which the semiconductor chip 110 may be photosensitive. This is, in particular, the case if the semiconductor material of the semiconductor substrate 120 and the semiconductor material of the semiconductor chip 110 are the same, e.g., silicon.

FIG. 2 illustrates a semiconductor device 200. The semiconductor device 200 may, e.g., be similar to the semiconductor device 100 except that the recess 121 in the semiconductor substrate 120 does not run completely through the semiconductor substrate 120. That is, in semiconductor device 200, the bottom 122 of the recess 121 may be formed by semiconductor material of the semiconductor substrate 120. In this case, the contact pads 131 of the electrical interconnect structure 130 are formed at the semiconductor material of the semiconductor substrate 120. All other features of the semiconductor device 200 may, e.g., be identical with the corresponding features of the semiconductor device 100, in particular the elements thereof, the dimensions of the elements, etc.

FIG. 3 illustrates a semiconductor device 300. Semiconductor device 300 may, e.g., be similar to the semiconductor device 100. However more (optional) details are disclosed in semiconductor device 300, by way of example.

More specifically, in view of the electrical interconnect structure 130, the recess contact pads 131 are, e.g., connected to a second structured metal layer 132. The electrical connections between the recess contact pads 131 and the second structured metal layer 132 may, e.g., be established by vias 133 running through the layer 150 of insulating material. The vias 133 may, e.g., comprise or be made of copper or tungsten. The electrical interconnect structure 130 and/or the insulating layer 150, in particular if being made of an inorganic material, may have a thickness T3 in a range between, e.g., 1 µm and 30 µm. More particular T3 may, e.g., be equal or less than 20 µm, 10 µm, 8 µm, 5 µm, 3 µm.

Further, the semiconductor device 300 may, e.g., comprise external terminals 160. The external terminals 160 may, e.g., be exposed at the periphery of the semiconductor device 300. They may, e.g., be arranged at a lower main surface of the electrical interconnect structure 130 facing away from the first main surface 123 of the semiconductor substrate 120. The external terminals 160 may be established by terminal pads 161 or by other external terminal elements such as, e.g., leads, posts, etc.

The terminal pads 161 may be made of any of the materials mentioned above. The terminal pads 161 may be spaced apart by a pitch P. The pitch P is measured between the centers of adjacent terminal elements, e.g., terminal pads 161. P may be equal to or greater than, e.g., 200 µm, 300 µm, 400 µm, 500 µm. Further, the pitch P may be equal to or less than, e.g., 500 µm, 400 µm, 300 µm, 200 µm. By way of example, the terminal pads 161 may have lateral dimensions of, e.g., equal to or greater than 100×100 µm, 150×150 µm, 200×200 µm, etc.

Further, FIG. 3 illustrates that the space between the semiconductor chip 110 and the recess 121 may be filled by, e.g., a polymer material 310. The polymer material 310 may, e.g., be a mold material, a resin, a photoresist, e.g., SU8, etc. The polymer material 310 may completely cover the second main surface 112 of the semiconductor chip 110. By way of example, an upper surface 311 of the polymer material 310 may, e.g., level with the first main surface 123 of the semiconductor substrate 120.

The polymer material 310 may be intransparent to light. The polymer material 310 may, e.g., be intransparent to light in a wavelength range in which the semiconductor chip 110 is photosensitive. That way, the semiconductor chip 110 is protected against radiation altering its electrical properties by the polymer material 310.

All other features of the semiconductor device 300 may, e.g., be identical with the corresponding features of the semiconductor device 100, in particular the elements thereof, the dimensions of the elements, etc.

FIG. 4 illustrates a semiconductor device 400. The semiconductor device 400 may, e.g., be similar to the semiconductor device 200; however, more (optional) details are disclosed in regard to semiconductor device 400, by way of example.

More specifically, in view of the electrical interconnect structure 130, the recess contact pads 131 are, e.g., connected to a second structured metal layer 132 as explained above in conjunction with FIG. 3. Reference is made to the corresponding disclosure for the sake of brevity and to avoid repetition.

Further, the semiconductor device 400 may, e.g., comprise external terminals 160. Further, similar to the semiconductor device 300 shown in FIG. 3, the space between the semiconductor chip 110 and the recess 121 may be filled by, e.g., a polymer material 310. Again, reference is made to the disclosure in conjunction with FIG. 3 to avoid repetition.

All other features of the semiconductor device 400 may, e.g., be identical with the corresponding features of the semiconductor device 200, in particular, the elements thereof, the dimensions of the elements, etc.

Referring to FIG. 5A, a wafer 500 is provided. The wafer 500 comprises a semiconductor substrate 120. Further, the wafer 500 may comprise an electrical interconnect structure 130 generated at a second main surface 124 of the semiconductor substrate 120. Here, the second main surface 124 of the semiconductor substrate 120 is the top surface thereof.

As indicated above, the electrical interconnect structure 130 may have been generated in various different ways. By way of example, as a first possibility, the electrical interconnect structure 130 may have been generated during frontend wafer processing. In this case, the electrical interconnect structure 130 may comprise one or multiple insulating layers 150 made of, e.g., an inorganic material such as, e.g., silicon oxide, silicon nitride, or mixed silicon oxide-nitride, etc, and one or multiple structured metal layers which are made of, e.g., copper, aluminum, tungsten, etc. These materials and suitable processes to deposit and structure such insulating and conductive materials on wafer level are well known in the art of wafer frontend processing and allow to obtain structural dimensions in the micrometer and sub-micrometer regime. In other words, in this case, the precision and tolerances of manufacturing the wiring of the electrical interconnect structure 130 (e.g., the structured metal layers 161, 132, 131 and the vias 133) may be comparable with the precision and tolerances experienced in manufacturing the metal layers (not shown) of the semiconductor chip 110, in particular the last metal layer thereof establishing the chip electrodes (not shown). Therefore, as the electrical interconnect structure 130 may be manufactured with high structural precision, semiconductor chips 110 having a high number of chip electrodes may be used in the following packaging process (see FIG. 5C).

By way of example, as a second possibility, the electrical interconnect structure 130 may have been generated during backend processing by using, e.g., thin film techniques known in the art of packaging. In this case, the electrical interconnect structure 130 may, e.g., comprise one or multiple insulating layers 150 made of an organic material such as, e.g., a polymer. The polymer layers may, e.g., be made of one or more of, e.g., epoxy, acrylate or polyimide. Specific examples of materials which may be used for the polymer layers are PEEK (polyetheretherketone), PPS (polyphenylsulphone), PSU (polysulfone), PEI (polyetherimide), PAI (polyamidimide) and LCP (liquid crystalline polymers).tride, etc. The metal layers 161, 132, 131 and the vias 133 may be applied by deposition processes such as, e.g., galvanic deposition, electroless deposition, etc. Materials and processes suitable to deposit and structure insulating and conductive materials on wafer level packaging (WLP) are well known in the art of wafer backend processing and allow to obtain structural dimensions in the tens of micrometer regime. In other words, in this case, the tolerances of manufacturing the wiring of the electrical interconnect structure 130 (e.g., the structured metal layers 161, 132, 131 and the vias 133) may be considerably larger than the tolerances experienced in semiconductor chip manufacturing. Electrical interconnect structures 130 manufactured during WLP are often referred to as redistribution structures (RDL) in the art.

Referring to FIG. 5B, a plurality of recesses 121 is generated in the first main surface 123 of the semiconductor substrate 120 of the wafer 500. The recesses 121 may be formed by appropriate material removing processes such as, e.g., etching, in particular anisotropic etching, chemical etching, dry etching, wet etching, in particular anisotropic dry or wet etching, reactive ion etching, mechanical machining, e.g., milling, cutting, etc., or other techniques of microstructuring of semiconductor materials, e.g., silicon.

As already mentioned, the semiconductor substrate 120 may be a bulk semiconductor material. It may, e.g., be a silicon wafer. Thus, recess generation may, e.g., be accomplished by selective semiconductor material etching. If the electrical interconnect structure 130 or, more specifically, e.g., the insulating layer 150 thereof is made of a material different from the semiconductor material of the semiconductor substrate 120, this material may act as an etch stop.

More specifically, by way of example, the layer 150 of insulating material of the electrical interconnect structure 130 may serve as an etch stop layer. In particular, the layer 150 of insulating material may be a silicon oxide material which is known to provide a suitable etch stop layer for silicon etching. In this case, as exemplified in FIG. 5B, the recesses 121 may fully traverse the semiconductor substrate 120 and may expose the layer 150 of insulating material and, e.g., the recess contact pads 131.

Referring to FIG. 5C, the wafer 500 may then, e.g., be turned upside down. Turning the wafer 500 upside down may be done by turning a temporary carrier (not shown) to which the wafer is fixed by, e.g., 180°.

Still referring to FIG. 5C, a plurality of semiconductor chips 110 may then be inserted into the plurality of recesses 121. The plurality of semiconductor chips 110 may be inserted in a flip-chip orientation into the plurality of recesses 121, i.e., the chip electrodes (not shown) are facing the recess contact pads 131 and are aligned thereto.

When introducing the semiconductor chips 110 into the recesses 121, the electrical contact elements 140 may have already been attached to the chip electrodes, as illustrated in FIG. 5C. However, it is also possible that the electrical contact elements 140 are attached to the recess contact pads 131 prior to inserting the semiconductor chips 110 into the recesses 121.

Referring to FIG. 5D, the plurality of chip electrodes are then electrically and mechanically connected to the electrical interconnect structure 130 of the wafer 500 by using the electrical contact elements 140. In other words, the semiconductor chips 110 are mounted in the recesses 121. Attaching the semiconductor chips 110 to the electrical interconnect structure 130 may involve applying energy (e.g., heat, radiation, etc.) to the wafer 500. By way of example, soldering, conductive gluing, sintering, nano past curing and other processes may be used to electrically connect and mechanically fix the chip electrodes (not shown) to the recess contact pads 131 by the electrical contact elements 140. By way of example, if the electrical contact elements 140 are solder bumps or solder deposits, a reflow process may, e.g., be used.

Referring to FIG. 5E, the wafer 500 may then be separated into a plurality of semiconductor devices 100. Separating may be performed by, e.g., etching, sawing (e.g., by using a saw blade), laser dicing, in particular stealth dicing, etc. A separation line (separation street) is indicated in FIG. 5E by a dashed line. It is to be noted that the metal layers of the electrical interconnect structure 130 and/or the terminal pads 161 may, e.g., be configured to not intersect with the separation street along which separation of the wafer 500 into the plurality of semiconductor devices 100-400 is performed.

The processes explained above with reference to FIGS. 5A-5E may be performed in different order. By way of example, it is possible that the process of separating the wafer 500 into single semiconductor devices 100-400 may be performed after the process of recess 121 formation (i.e., FIG. 5B) but prior to the process of semiconductor chip 110 placement (i.e., FIG. 5C). Generally speaking, each of the processes disclosed in FIGS. 5B-5D may, e.g., be performed on wafer level, i.e., by WLP, or on package level, i.e., after the separation of the wafer 500 into single semiconductor devices (packages) 100-400.

Figure 6A:
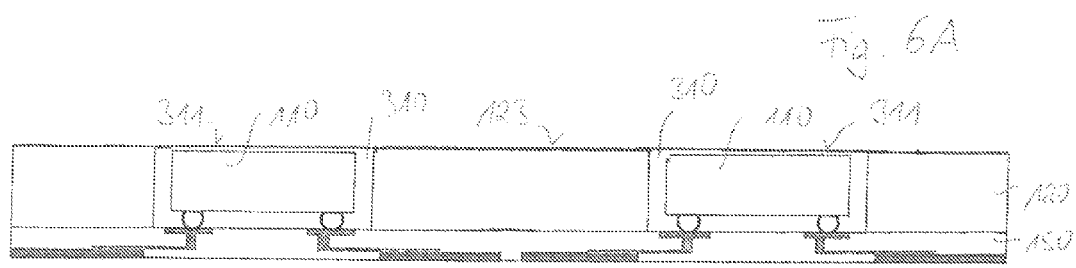
FIGS. 6A and 6B schematically illustrate cross-sectional views of an exemplary process of a method of manufacturing a semiconductor device.
Figure 6B:
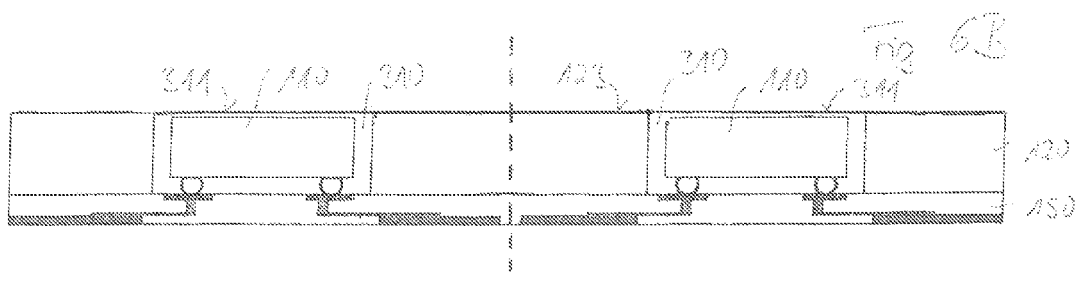

FIGS. 6A and 6B schematically illustrate cross-sectional views of stages of an exemplary process of a method of manufacturing the semiconductor device 300. The process shown in FIG. 6A may follow the processes as described in conjunction with FIGS. 5A-5D, and reference is made to the corresponding disclosure above.

FIG. 6A illustrates that the spaces between the semiconductor chips 110 and the recesses 121 in a wafer 600 may be filled by the polymer material 310 using a WLP process. Various techniques may be employed to apply the polymer material 310, e.g., molding, in particular compression molding, injection molding, or liquid molding. Other possible techniques are, e.g., dispersion, lamination, printing etc.

Further, the process shown in FIG. 6A may comprise applying energy to the wafer 600, e.g., heat, radiation, etc. The application of energy may, e.g., be used to harden or cure the polymer material 310. Further, it is possible that the application of energy simultaneously provides for electrically connecting and mechanically fixing the chip electrodes (not shown) to the recess contact pads 131 by the electrical contact elements 140. In this case, the process of mounting the semiconductor chips 110 as described earlier in conjunction with FIG. 5D may be simultaneously carried out with the process exemplified by FIG. 6A.

It is to be noted that by filling the recesses 121 with polymer material 310, the first main surfaces 123 of the semiconductor chips 110 may be completely covered by molding material 310. Further, a planar upper surface composed of first main surfaces 123 of the semiconductor substrate 120 and the upper surfaces 311 of the polymer material 310 may, e.g., be obtained. In other implementations, the upper surfaces 311 of the polymer material 310 may, e.g., be on a level below the level of the first main surfaces 123 of the semiconductor substrate 120. In both cases, the polymer material 310 may form part of the periphery of the package of the semiconductor device 300.

FIG. 6B illustrates that the wafer 600 may then be separated into a plurality of semiconductor devices 300. Separation may be performed, e.g., by the same processes as disclosed above in conjunction with FIG. 5E, to which reference is made to avoid repetition.

Figure 7A:
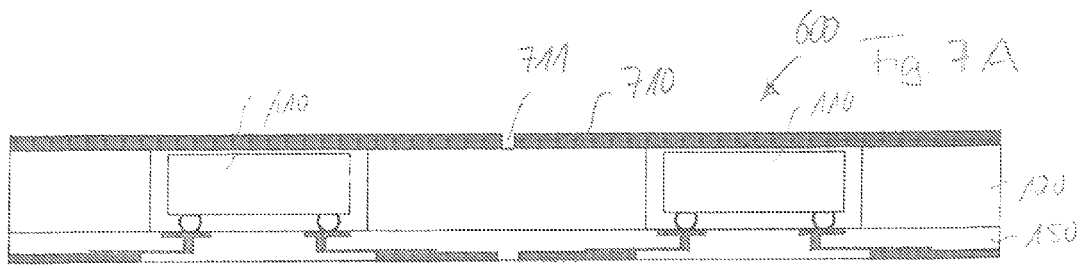
FIGS. 7A-7C schematically illustrate cross-sectional views of an exemplary process of a method of manufacturing a semiconductor device.
Figure 7B:
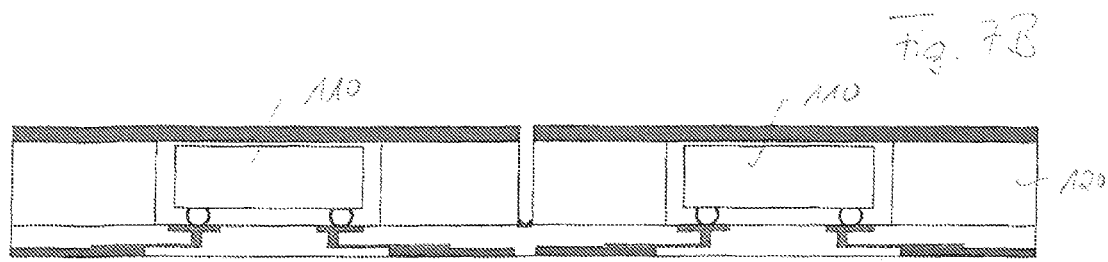
Figures 7C, 7D:
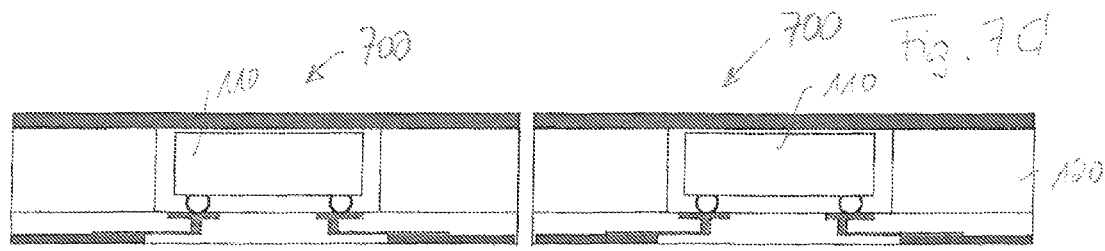

FIGS. 7A-7C schematically illustrate cross-sectional views of stages of an exemplary process of a method of manufacturing the semiconductor device 700. The process shown in FIG. 7A may be a continuation of the processes described in conjunction with FIG. 6A, and reference is made to the corresponding description above.

FIG. 7A illustrates that a mask layer 710 is applied over the upper surface of the wafer 600 composed of, e.g., the first main surface 123 of the semiconductor substrate 120 and the upper surface 311 of the polymer material 310. The mask layer 710 may be structured to have, e.g., linear openings 711 exposing the first main surface 123 of the semiconductor substrate 120 along separation streets.

By way of example, the mask layer 710 may comprise, e.g., a photoresist material, e.g., SU8. The mask layer 710 may, e.g., be applied as an unstructured, continuous layer, e.g., by using spin coating, PVD, CVD, or other techniques. Structuring of the mask layer 710 may then be performed, e.g., by lithography, direct laser writing, etc. Further, it is possible that the mask layer 710 is applied as a pre-structured layer, e.g., by printing, lamination, etc.

The mask layer 710 may comprise or be made of the same material as the polymer material 310 used for filling the recesses 121. Further, the mask layer 710 may, e.g., be applied during the same process by which the polymer material 310 is applied, i.e., during the process of recess 121 filling. By way of example, the polymer material 310 and the mask layer 710 may be formed in one molding process. When using a molding process, it is, e.g., also possible to pre-structure the mask layer 710 during molding by forming the linear openings 711 by blade structures protruding from an inner wall of the upper mold half defining the shape of the mold cavity.

Referring to FIG. 7B, a semiconductor material etch process may then be performed in order to divide the substrate 120 of the wafer 600 into a plurality of substrates 120 of the single semiconductor devices 700. The etch process uses the mask layer 710 to define the separation streets. By way of example, silicon etching is carried out. Chemical etching, dry etching, wet etching, etc. may be used. Blade sawing to divide the wafer 600 may be omitted. If a layer 150 of insulating material, e.g., comprising or be made of silicon oxide, is used, the semiconductor etch process may stop at the layer 150 of insulating material.

According to FIG. 7C, e.g., a second etch process may follow to completely divide the wafer 600 into single semiconductor devices 700. The second etch process may be selective to the material of the layer 150 of insulating material. The electrical interconnect structure 130 may be configured to guarantee that no metal intersects the separation streets.

In other embodiments, layer 710 may not necessarily be a mask layer. By way of example, layer 710 also be a metal layer. The metal layer 710 may be applied by lamination, soldering, gluing, etc. of a metal foil to the upper surface of the wafer 600. It is also possible that the metal layer 710 may be applied by a plating process, e.g., by galvanic plating or electroless plating.

If a galvanic plating process is used, a seed layer (not shown) may be deposited onto the upper surface of the wafer 600 composed of, e.g., the first main surfaces 123 of the semiconductor substrate 120 and the upper surfaces 311 of the polymer material 310. The seed layer may have a thickness of, e.g., up to 1 μm and may, for example, be made of zinc. If the metal layer 710 is intended to be used as a mask as explained above, the seed layer may be structured. In other embodiments, the seed layer may be continuous, i.e., unstructured. Then, the seed layer is employed as an electrode, and copper or other metals or metal alloys may be plated onto the seed layer to the desired height.

Alternatively, electroless plating may be used to generate the metal layer 710. Electroless plating is also referred to as chemical plating in the art. Further, other deposition methods such as, e.g., physical vapor deposition (PVD), chemical vapor deposition (CVD), sputtering, spin-on processes, spray deposition or printing such as, e.g., ink-jet printing may be employed to form the metal layer 710.

The metal layer 710 may, e.g., have a thickness equal to or greater than 5 μm, 10 μm, 20 μm, 50 μm, 100 μm. In particular, the metal layer 710 may serve as a heat sink, e.g., in cases in which the heat dissipation via the electrical contact elements 140 is not sufficient.

Figure 8:
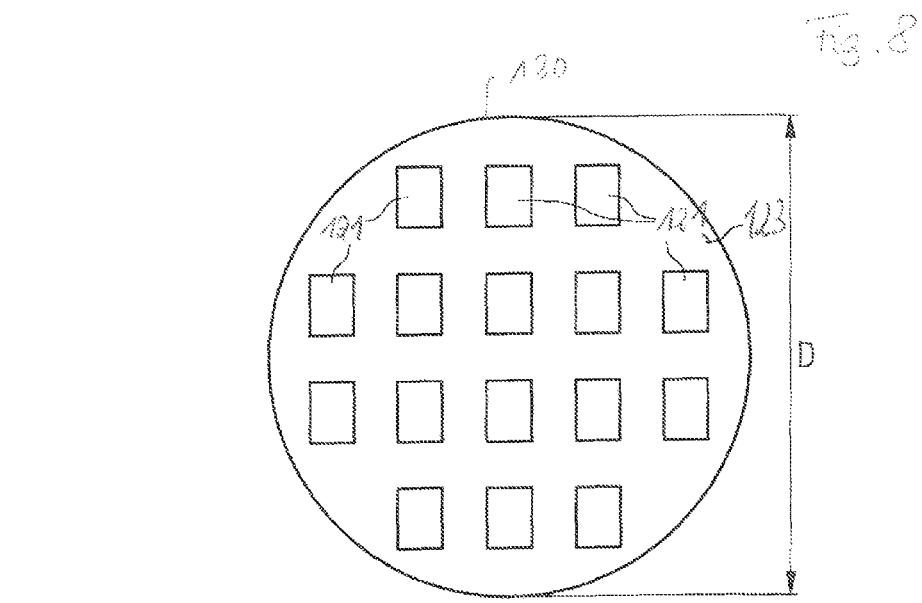
FIG. 8 schematically illustrates a plan view of a semiconductor wafer provided with a pattern of recesses.

Referring to FIG. 8, a plan view of wafers 500, 600 is shown. By way of example, the wafers 500, 600 may, e.g., be disc-shaped having a diameter D of, e.g., equal to or greater than 200 or 300 mm, or may have any other shape such as a polygonal shape and the same or other lateral dimensions. The recesses 121 may be distributed in a regular pattern across the first main surface 123 of the wafer substrate 120. More than tens or hundreds of recesses 121 may be provided in one wafer 500, 600. As the semiconductor devices 100, 200, 300, 400, 700 may be produced by using a WLP process, it is to be noted that the distances between adjacent recesses 121 may, e.g., be equal to twice the width W of the semiconductor devices 100, 200, 300, 400, 700 (plus the width of a separation street).

FIG. 9 schematically illustrates a plan view of an exemplary semiconductor device 900 when looked on the electrical interconnect structure 130. The semiconductor device 900 may have a cross sectional design along line A-A as exemplified, e.g., in FIGS. 1-7C. Some of the structures shown in FIG. 9, such as, e.g., the semiconductor chip 110 and the recess 121, are illustrated in FIG. 9 although they would not be visible if looked on the electrical interconnect structure 130.

As apparent in FIG. 9, the semiconductor chip 110 may, e.g., completely be surrounded in a lateral direction by the semiconductor substrate 120, i.e., the semiconductor substrate 120 may have the shape of a closed frame encompassing the semiconductor chip 110.

FIG. 9 illustrates that the semiconductor device 900 may be a fan-out type package. In a fan-out type package at least some of the external contact pads, i.e., terminal pads 161, and/or conductor lines, i.e., the second structured metal layer 132 connecting the semiconductor chip 110 to the terminal pad 161, are located laterally outside of the outline of the semiconductor chip 110 or do at least intersect the outline of the semiconductor chip 110. Thus, a peripherally outer part of the package may (additionally) be used for electrically bonding the semiconductor device 900 to external applications, such as application boards, etc. This outer part of the package encompassing the semiconductor chip 110 effectively enlarges the contact area of the package in relation to the footprint of the semiconductor chip 110, thus leading to relaxed constrains in view of package pad size and pitch.

Further, it is to be noted that if the electrical interconnect structure 130 is implemented by an inorganic layer such as, e.g., silicon oxide, silicon nitride or mixed silicon oxide-nitride, fine structural dimensions may be designed. By way of example, the distance between adjacent conducting lines and/or terminal pads 161 may be equal to or less than 10 μm, allowing to obtain small lateral package dimensions even in case of a high number of external terminals of, e.g., equal to or greater than 50, 80 or 100.

FIG. 10 schematically illustrates a plan view of an exemplary semiconductor device 1000 when looked on the electrical interconnect structure 130. The semiconductor device 1000 may be similar to the semiconductor device 900, except that the electrical interconnect structure 130 comprises one or more passive elements. The passive elements are formed in a zone of the electrical interconnect structure 130 which at least partly overlaps with the footprint of the semiconductor chip 110. The passive element(s) may, e.g., be a resistor, a capacitor and/or an inductor.

By way of example, without loss of generality, the passive elements 1010, 1020 are inductors. The inductors 1010 are located outside of the recess 121, whereas the inductor 1020 is located within the outline of the recess 121. The semiconductor chip 110 may comprise RF (radio frequency) circuitry, which is coupled to the inductors 1010 and/or the inductor 1020. By way of example, the semiconductor device 1000 may implement an antenna switch, an antenna tuner, or any other RF semiconductor device.

The inductors 1010, 1020 may be implemented in the first structured metal layer (i.e., the metal layer in which the recess contact pads 131 are structured), the second structured metal layer 132 or in the last metal layer in which the terminal pads 161 are formed. In the latter case the inductors 1010, 1020 may be exposed at the layer of insulating material 150. It is to be noted that, e.g., only two metal layers are provided in the electrical interconnect structure 130.

If the electrical interconnect structure 130 comprises or is made of an inorganic insulating layer 150 as mentioned above, high values of inductance, e.g., equal to or greater than 5 nH, 10 nH, 15 nH, 20 nH per inductor 1010, 1020 may be obtained. Such high values of inductance may be feasible because the conducting lines of the inductors 1010, 1020 may be designed with a high precision and a small spacing. By way of example, the spacing between adjacent conducting lines of the inductor coils 1010, 1020 may be equal to or less than, e.g., 5 µm, 2 µm, 1 µm. Such small spacing allows to obtain the high values of inductance. On the other hand, if the electrical interconnect structure 130 is made of a polymer material, the spacing between adjacent conducting lines of the inductor coils are typically greater, and the conductance of each inductor 1010, 1020 is typically smaller than 2 nH.

In general, one or more semiconductor chips 110 may be accommodated in one recess 121. Further, in general, it is possible that one single semiconductor device comprises a plurality of recesses 121, wherein each of the recesses 121 accommodates one or more semiconductor chips 110.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a semiconductor substrate having a first main surface which comprises a recess;
    an electrical interconnect structure arranged at a bottom of the recess, wherein the electrical interconnect structure comprises an insulating layer disposed on the semiconductor substrate;
    a semiconductor chip located in the recess, wherein the semiconductor chip comprises a plurality of chip electrodes facing the electrical interconnect structure; and
    a plurality of electrically conducting elements arranged in the electrical interconnect structure and electrically connected to the plurality of chip electrodes.

2. The semiconductor device of claim 1, further comprising: a plurality of external terminals of the semiconductor device arranged at a main surface of the electrical interconnect structure which faces away from the first main surface.

3. The semiconductor device of claim 1, wherein the electrical interconnect structure comprises a first structured metal layer.

4. The semiconductor device of claim 1, wherein the insulating layer comprises an inorganic material.

5. The semiconductor device of claim 4, wherein the inorganic material comprises a material selected from the group consisting of silicon oxide, silicon nitride, and mixed silicon oxide-nitride.

6. the semiconductor device of claim 1, wherein the insulating layer comprises an organic material.

7. The semiconductor device of claim 1, wherein the electrical interconnect structure further comprises a second structured metal layer which comprises a plurality of external terminals of the semiconductor device.

8. The semiconductor device of claim 1, further comprising a passive element formed in the electrical interconnect structure.

9. The semiconductor device of claim 8, wherein the passive element is formed in a zone of the electrical interconnect structure that at least partly overlaps with a footprint of the semiconductor chip.

10. The semiconductor device of claim 8, wherein the passive element comprises a resistor, a capacitor or an inductor.

11. The semiconductor device of claim 8, wherein the passive element comprises an inductor having an inductance greater than 5 nH.

12. The semiconductor device of claim 1, further comprising a polymer material filling a space between the semiconductor chip and the recess.

13. The semiconductor device of claim 1, further comprising a metal layer extending over the first main surface of the semiconductor substrate and over the recess.

14. An array of semiconductor devices, comprising:
    a semiconductor wafer having a first main surface that comprises a plurality of recesses;
    an electrical interconnect structure forming bottoms of the plurality of recesses, wherein the electrical interconnect structure comprises an insulating layer disposed on the semiconductor wafer
    a plurality of semiconductor chips located in the plurality of recesses, wherein each of the plurality of semiconductor chips comprises a plurality of chip electrodes facing the electrical interconnect structure; and
    a plurality of electrically conducting elements arranged in the electrical interconnect structure and electrically connected to the plurality of chip electrodes at each of the plurality of recesses.

15. The array of semiconductor devices of claim 14, further comprising a photoresist layer extending over the first main surface of the semiconductor wafer and the plurality of recesses.

* * * * *